(12) United States Patent
Lin et al.

(10) Patent No.: US 11,250,754 B2
(45) Date of Patent: Feb. 15, 2022

(54) DRIVING CIRCUIT WITH MULTIPLE STAGE REGISTERS PERFORMING VOLTAGE REGULATION

(71) Applicant: AU Optronics Corporation, Hsin-Chu (TW)

(72) Inventors: Wei-Li Lin, Hsin-Chu (TW); Che-Wei Tung, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/941,624

(22) Filed: Jul. 29, 2020

(65) Prior Publication Data

US 2021/0174720 A1 Jun. 10, 2021

(30) Foreign Application Priority Data

Dec. 6, 2019 (TW) .................................. 108144792

(51) Int. Cl.
*G09G 3/20* (2006.01)

(52) U.S. Cl.
CPC ....... *G09G 3/20* (2013.01); *G09G 2310/0267* (2013.01); *G09G 2310/0283* (2013.01); *G09G 2310/0286* (2013.01)

(58) Field of Classification Search
CPC .................. G09G 3/20; G09G 3/3266; G09G 3/3674–3681; G09G 2310/0267; G09G 2310/0286
See application file for complete search history.

(56) References Cited

U.S. PATENT DOCUMENTS

| | | | | |
|---|---|---|---|---|
| 9,396,682 B2* | 7/2016 | Xia | ..................... | G09G 3/3674 |
| 9,626,890 B2 | 4/2017 | Lin et al. | | |
| 10,002,558 B2* | 6/2018 | Ma | ..................... | G09G 3/3677 |
| 10,068,658 B2* | 9/2018 | Wang | ..................... | G11C 19/28 |
| 10,283,030 B2* | 5/2019 | Zhou | ..................... | G09G 3/20 |
| 10,629,630 B2* | 4/2020 | Yoshida | ..................... | G09G 3/20 |
| 10,762,975 B2* | 9/2020 | Li | ..................... | G09G 3/20 |
| 2011/0116592 A1* | 5/2011 | Tsai | ..................... | G11C 19/184 |
| | | | | 377/79 |
| 2015/0213762 A1* | 7/2015 | Xia | ..................... | G09G 3/3266 |
| | | | | 345/215 |
| 2017/0092376 A1* | 3/2017 | Wang | ..................... | G11C 19/287 |
| 2017/0278450 A1* | 9/2017 | Ma | ..................... | G09G 3/3648 |

(Continued)

FOREIGN PATENT DOCUMENTS

CN 108962168 A 12/2018

*Primary Examiner* — Gene W Lee
(74) *Attorney, Agent, or Firm* — WPAT, PC

(57) ABSTRACT

A driving circuit includes a S stage register, a first connect line, a (S+A) stage register and a second connect line. The S stage register receives a S stage control signal through a first switch unit and a second switch unit, so that the S stage register performs voltage regulation and outputs a S stage scan signal. The first connect line is electrically connected to the first switch unit of the S stage register. A third switch unit of the (S+A) stage register is electrically connected to the first connect line and a fourth switch unit of the (S+A) stage register for receiving the S stage scan signal, so that The (S+A) stage register performs voltage regulation. The second connect line is electrically connected to the second switch unit of the S stage register and the fourth switch unit of the (S+A) stage register.

10 Claims, 6 Drawing Sheets

(56) References Cited

U.S. PATENT DOCUMENTS

| | | | |
|---|---|---|---|
| 2017/0316731 A1* | 11/2017 | Cho | G09G 3/2092 |
| 2018/0301075 A1* | 10/2018 | Zhou | G09G 3/20 |
| 2019/0172843 A1* | 6/2019 | Yoshida | G09G 3/3677 |
| 2019/0325978 A1* | 10/2019 | Li | G09G 3/20 |
| 2019/0340967 A1* | 11/2019 | Zhang | G09G 3/20 |
| 2020/0027515 A1* | 1/2020 | Gu | G09G 3/20 |
| 2020/0082746 A1 | 3/2020 | Zhang et al. | |

* cited by examiner

DRIVING CIRCUIT WITH MULTIPLE STAGE REGISTERS PERFORMING VOLTAGE REGULATION

CROSS-REFERENCE TO RELATED APPLICATION

This application claims priority to Taiwan Application Serial Number 108144792, filed Dec. 6, 2019, which is herein incorporated by reference in its entirety.

BACKGROUND

Technical Field

The present disclosure relates to a driving circuit, which performs voltage regulation according to the control signal to output a scanning signal.

Description of Related Art

With the rapid development of display technology, the display panel is widely used in daily lives and has an increasingly important position. For example, the display panel can be used in various electronic devices such as TVs, computers, mobile phones, etc. to display various information Currently, the design trend of the display panel is thin and light. Alternatively stated, the frame of the display panel should preferably have a small width. Therefore, the Gate Driver on Array (GOA) technology was developed accordingly. However, in the situation that the resolution and refresh rate of the signal resolution are getting higher and higher, the area on the display panel that can be used to layout the GOA circuit is relatively reduced, which has become a design challenge.

SUMMARY

One aspect of the present disclosure is a driving circuit, comprising an S stage register, a first connect line, an (S+A) stage register and a second connect line. The S stage register comprises a first voltage regulator circuit. The first voltage regulator circuit comprises a first switch unit of the S stage register and a second switch unit of the S stage register. The first switch unit of the S stage register and the second switch unit of the S stage register are configured to receive an S stage control signal, so that the S stage register performs voltage regulation and outputs an S stage scan signal. The first connect line is electrically connected to the first switch unit of the S stage register. The (S+A) stage register comprises a first switch unit of the (S+A) stage register, a second switch unit of the (S+A) stage register, a third switch unit of the (S+A) stage register and a fourth switch unit of the (S+A) stage register. The third switch unit of the (S+A) stage register is electrically connected to the first connect line and the fourth switch unit of the (S+A) stage register to receive the S stage control signal, so that the (S+A) stage register performs voltage regulation, both S and A are positive integers. The second connect line is electrically connected to a control terminal of the second switch unit of the S stage register and a control terminal of the fourth switch unit of the (S+A) stage register.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
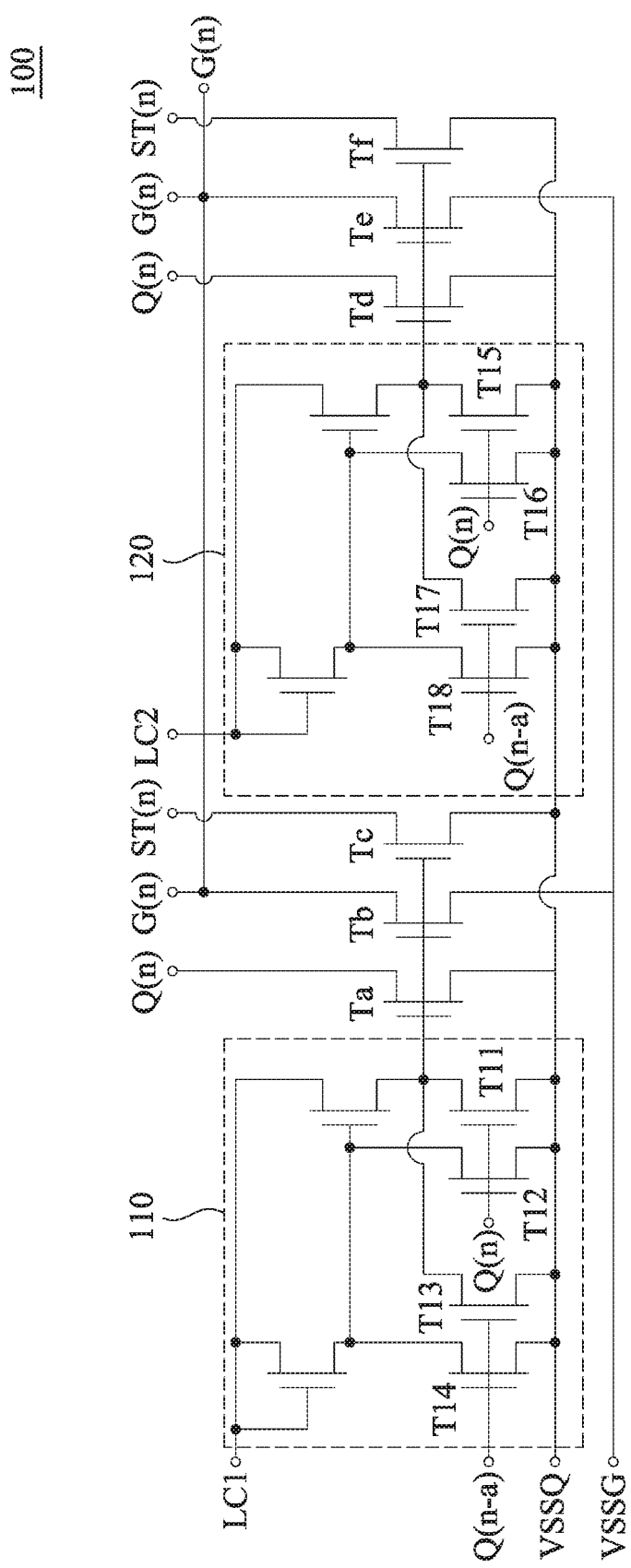
FIG. 1 is an equivalent circuit diagram of a driving circuit in some embodiments of the present disclosure.

FIG. 1 is an equivalent circuit diagram of a driving circuit 100 in some embodiments of the present disclosure. In some embodiments, the driving circuit 100 is applied to a display panel. The driving circuit 100 includes multiple registers configured to sequentially turn on multiple rows of transistor switches in the pixel circuit of the display panel through multiple gate lines, so as to drive the light emitting unit of the pixel circuit. FIG. 1 shows the Nth stages of registers in the driving circuit 100. Registers may be classified into multiple stages such as a first stage, a second stage ... a Nth stage according to the driving order. Registers of FIG. 1 include two voltage regulator circuits 110, 120 and multiple transistor switches Ta-Tf. When the transistor switch Tb or the transistor switch Te is turned off, the driving circuit 100 outputs a scan signal G(n) to drive the corresponding pixel circuit.

The voltage regulator circuits 110, 120 are configured to control the transistor switch Tb and the transistor switch Te to be turned on or turned off in turn, respectively, so as to reduce the stress effect of the transistor switch Tb and the transistor switch Te, and to improve life time. As shown in FIG. 1, the voltage regulator circuit 110 includes multiple switch units T11-T14 (i.e., field effect transistor, thin film transistor). The power supply VSSQ and the power supply VSSG are configured to regulate different node voltages, respectively (the power supply VSSQ corresponds to the node receiving the control signal Q(n), the power supply VSSG corresponds to the node receiving the scan signal G(n)). The voltage of power supply VSSQ is less than the voltage of the power supply VSSG. The control terminal of the switch unit T11 and the control terminal of the switch unit T12 are configured to receive the control signal Q(n). The control terminal of the switch unit T13 and the control terminal of the switch unit T14 are configured to receive the control signal Q(n-a). The control signal Q(n-a) is the control signal transmitted from the previous "a" stage, which is make the voltage regulator circuit 110 turns off the transistor switch Tb early to avoid delay. In some embodiments, the voltage regulator circuits 110, 120 may be implemented in or implemented by a pull-down circuit. When it is necessary to drive the corresponding pixel circuit, the voltage regulator circuits 110, 120 cooperate with the control signal LC1, LC2 to pull down the voltage of the control terminals of transistor switches Ta-Tf to turn off the transistor switches Ta-Tf, so that the Scan signal G(n) may be transmitted to the pixel circuit.

For example, if the register shown in FIG. 1 is the third stage register of the driving circuit, the switch unit T11 and the switch unit T12 are configured to receive the control signal Q(3), and the switch unit T13 and the switch unit T14 are configured to receive the control signal Q(1). Accordingly, when the first stage register outputs the scan signal, the third stage register simultaneously receives the control signal Q(1) to turn off the transistor switch Tb in advance. Similarly, the voltage regulator circuit 120 receives the control signal Q(n) through the switch unit T15 and the switch unit T16, and receives the control signal Q(n-a) through the switch unit T17 and the switch unit T18.

Figure 2:
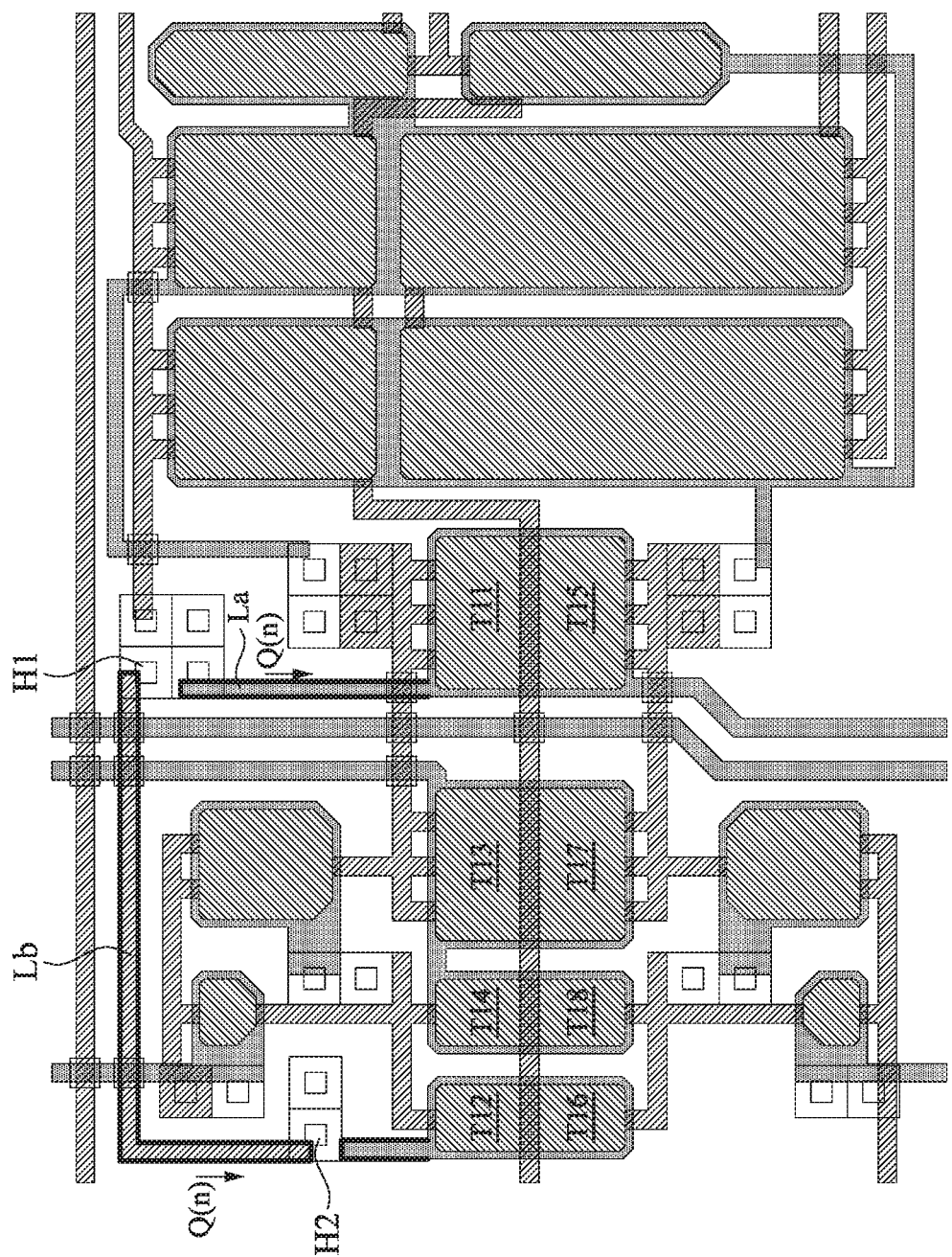
FIG. 2 is a layout diagram of the register of the driving circuit in some embodiments of the present disclosure.

FIG. 2 is a layout diagram of the register of the driving circuit 100 in some embodiments of the present disclosure, corresponds to the equivalent circuit diagram as illustrated in FIG. 1. As shown in FIG. 2, positions of the switch units T11-T14 in the voltage regulator circuit 110 shown in FIG. 1 corresponds to positions of the switch units T15-T18 in the voltage regulator circuit 120. The switch units T11, T15 receive the control signal Q(n) through the signal line La. The switch units T12 and T16 receive the control signal Q(n) through the signal line Lb. However, in the layout diagram shown in FIG. 2, the signal line Lb occupies too much area, so that the display panel unable to reduce the area of the frame. In addition, the signal line Lb must also pass through the two holes H1, H2, from one side of the circuit substrate to the other side, in order to successfully connect to the switch units T12, T16, but two holes H1, H2 will affect the stability of signal transmission.

Figure 3:
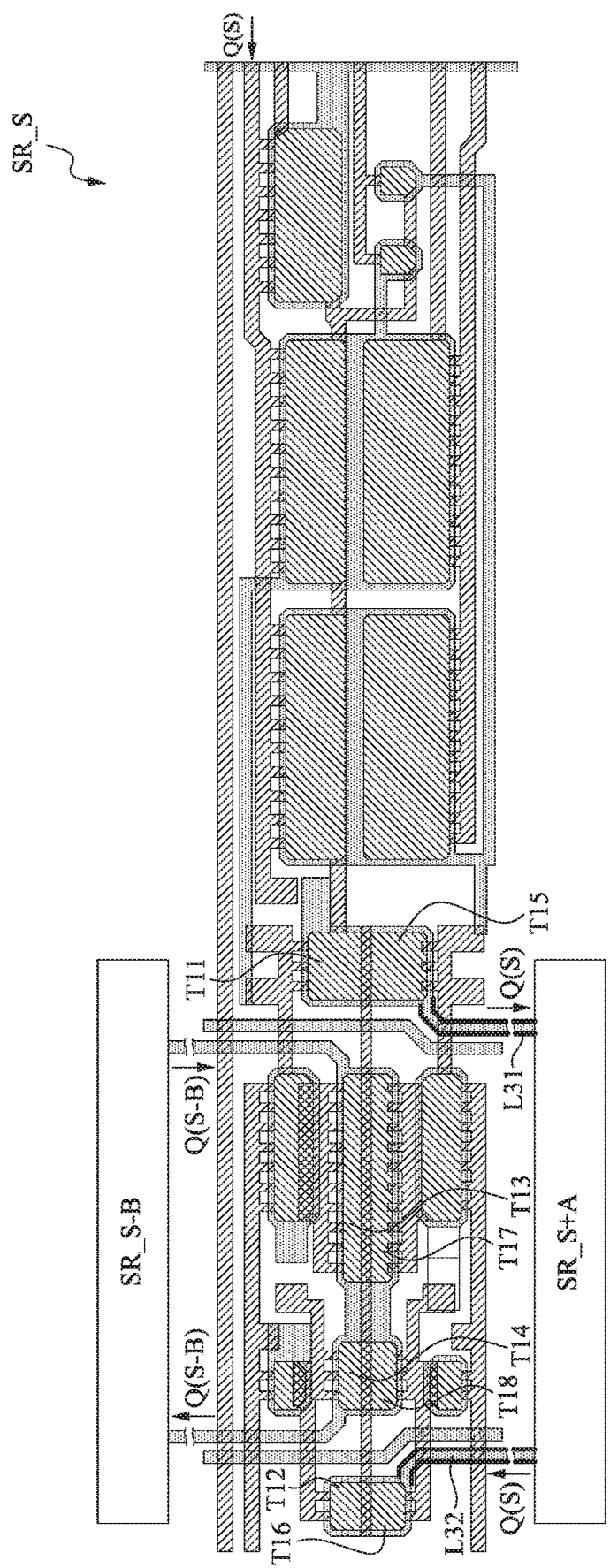
FIG. 3 is another layout diagram of the register of the driving circuit in some embodiments of the present disclosure.

FIG. 3 is another layout diagram of the register of the driving circuit 100 in some embodiments of the present disclosure. In some embodiments, the driving circuit 200 includes multiple stages of registers SR_S, SR_S+A, SR_S-B. S, A, B are all positive integers. The switch units T11 and T15 in the S stage register SR_S are configured to receive the S stage control signal Q(S). The control terminal of switch units T11, T15 are configured to transmit the S stage control signal Q(S) to the register SR_S+A through the first connect line L31, and connect back to the switch units T12, T16 through the second connect line L32. The switch units T13, T14 of the S stage register SR_S are configured to receive the (S-B) stage control signal Q(S-B) from the register SR_S-B. Accordingly, the connect lines L31 and L32 may be arranged in the gap between switch units without occupying too much area.

Figure 4A:
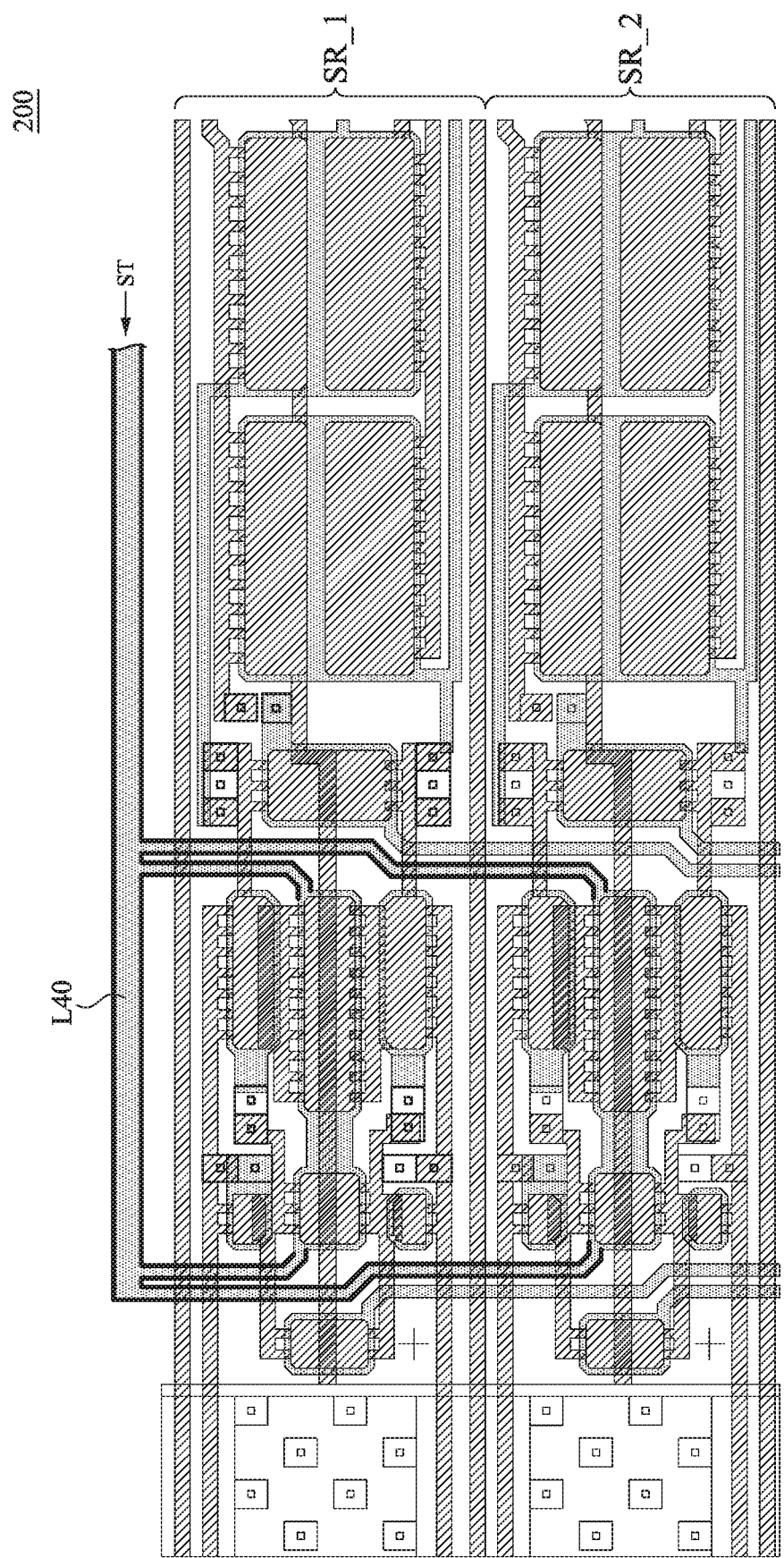
FIG. 4A is the layout diagram of the first stage register and the second stage register in the forefront of the driving circuit in some embodiments of the present disclosure.
Figure 4B:
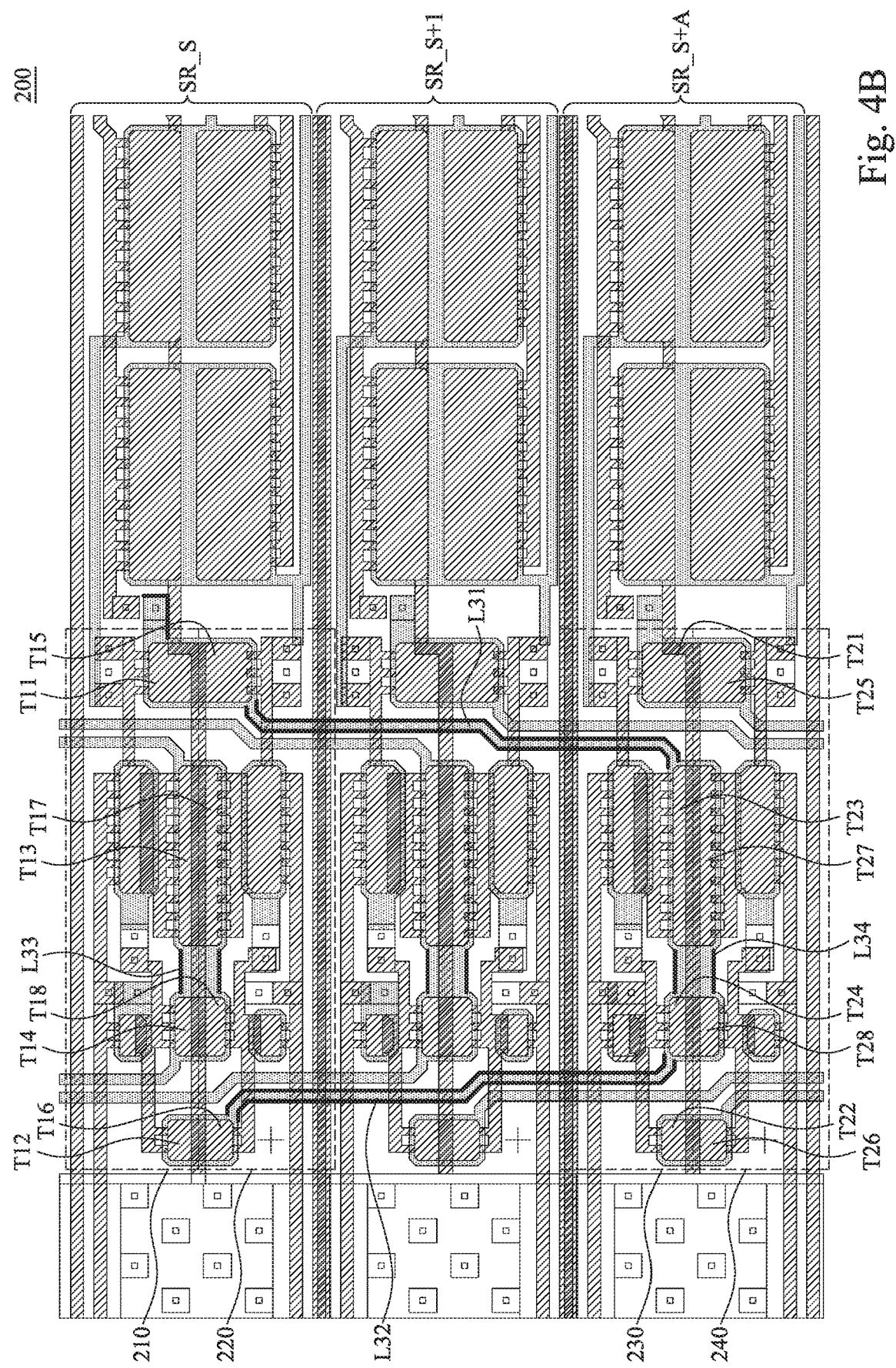
FIG. 4B is the layout diagram of the S stage register, the (S+1) stage register and the (S+A) stage register of the driving circuit in some embodiments of the present disclosure.
Figure 4C:
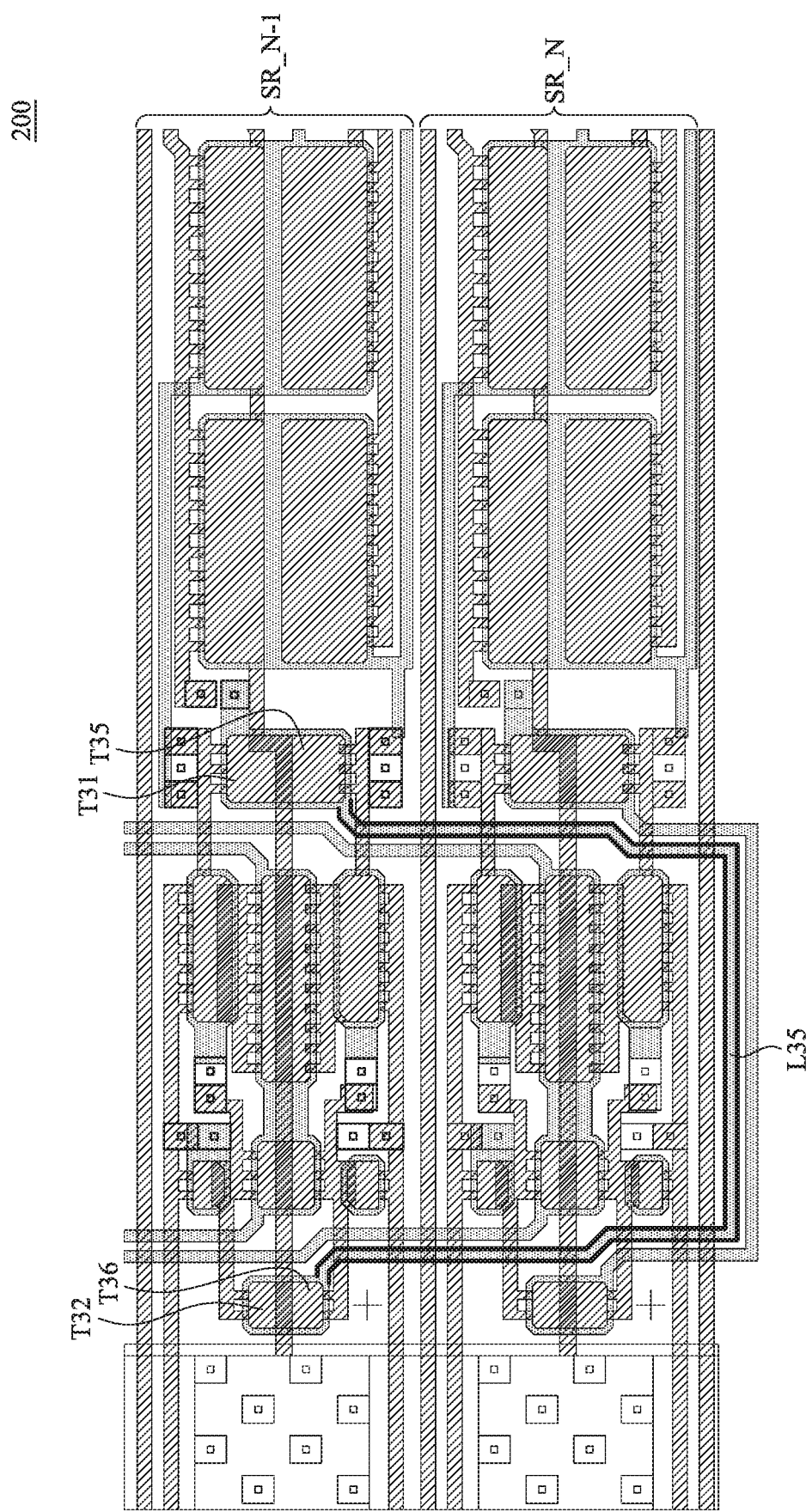
FIG. 4C is the layout diagram of the last two stages registers of the driving circuit in some embodiments of the present disclosure.

For convenience of explanation, the layout diagrams in FIGS. 4A-4C are used as an example. In some embodiments, the driving circuit 200 includes N registers and multiple connect lines. The registers SR_1-SR_N are arranged on the circuit substrate, and is arranged along a first direction (such as longitudinal direction) to be electrically connected to up to multiple gate lines, respectively. In FIGS. 4A-4C, multiple registers of the driving circuit 200 are arranged sequentially along the longitudinal direction, and both "A" and "B" are 2. That is, the register will receive the signal from the previous 2 stages (across "B" stages), and transmit the signal to the next 2 stages (across "A" stages). FIG. 4A shows the first stage register SR_1 and the second stage register SR_2 in the forefront of the driving circuit 200. FIG. 4B shows the S stage register SR_S, the (S+1) stage register SR_S+1, the (S+A) stage register SR_S+A. FIG. 4C shows the last two stage registers SR_N-1, SR_N. Both S and A are positive integers.

For example, the S stage register SR_S may be the third stage register in the driving circuit 200. The (S+A) stage register SR_S+A may be the fifth stage register in the driving circuit 200. Each of the registers includes two voltage regulator circuits as shown in FIG. 1. In some embodiments, The positions of the transistors in the voltage regulator circuit correspond to each other, and thus a description in this regard is not further provided herein.

As shown in FIG. 4A, the driving circuit 200 provides a trigger signal ST to the first stage register SR_1 and the second stage register SR_2 through the control line L40, respectively. The trigger signal ST is provided to the previous "A" stages register of the driving circuit 200 (in this embodiment, "A"=2), and is related to the control signal.

As shown in FIG. 4B, the S stage register SR_S includes the first voltage regulator circuit 210, and transmits the control signal through the first connect line L31, the second connect line L32. The first voltage regulator circuit 210 includes a first switch unit T11 of the S stage register SR_S, a second switch unit T12 of the S stage register SR_S, a third switch unit T13 of the S stage register SR_S, and a fourth switch unit T14 of the S stage register SR_S. The switch units T11-T14 correspond to the equivalent circuits shown in FIG. 1, so it will not be described here.

The control terminals (such as the gate of the transistor) of the first switch unit T11 of the S stage register and the second switch unit T12 of the S stage register are configured to receive the S stage control signal, so that the S stage register SR_S performs voltage regulation. For example, the S stage register SR_S turns off the switch units T11, T12 according to the S stage control signal, so that the driving circuit 200 outputs the S stage scan signal to the pixel circuit.

One terminal of the first connect line L31 is electrically connected to the control terminal of the first switch unit T11. The (S+A) stage register SR_S+A includes a first switch unit T21 of the (S+A) stage register SR_S+A, a second switch unit T22 of the (S+A) stage register SR_S+A, a third switch unit T23 of the (S+A) stage register SR_S+A, and a fourth switch unit T24 of the (S+A) stage register SR_S+A. The switch units T21-T24 correspond to the equivalent circuits shown in FIG. 1, so it will not be described the operation here. The control terminal of the third switch unit T23 is electrically connected to the other terminal of the first connect line L31, and connected to the fourth switch unit T24, so as to receive the S stage control signal, so that the (S+A) stage register SR_S+A performs voltage regulation. Alternatively stated, when the S stage register SR_S outputs the S stage scan signal, the (S+A) stage register SR_S+A turns off the switch units T23, T24 according to the S stage control signal. Since the (S+A) stage register SR_S+A has not received the (S+A) stage scan signal at this time, the (S+A) stage register SR_S+A will not drive the corresponding pixel circuit through the corresponding gate lines.

The second connect line L32 is electrically connected to control terminals of the second switch unit T12 and the fourth switch unit T24. Accordingly, using the connection path formed by "the first switch unit T11, the first connect line L31, third switch unit T23, the fourth switch unit T24, the second connect line L32, and the second switch unit T12", the second switch unit T12 may receive the S stage control signal without the additional connection line, so that the area required for the driving circuit 200 may be smaller.

In some embodiments, the first voltage regulator circuit 210 further includes a third switch unit T13 of the S stage register SR_S and a fourth switch unit T14 of the S stage register SR_S. The control terminals of the third switch unit T13 and the fourth switch unit T14 are electrically connected through the third connect line L33, so as to receive the (S−B) stage control signal (e.g., the control signal of the previous B stage, B is a positive integer, such as the control signal of the second stage), so that the S stage register SR_S performs voltage regulation. As shown in FIGS. 4A and 4B, the third switch unit T13 and the fourth switch unit T14 receive the (S-B) stage control signal (in this embodiment, both B and A are 2), so that the S stage register SR_S turns off the switch units T13, T14. Since when the third switch unit T13 and the fourth switch unit T14 receive the (S-B) stage control signal, the S stage register SR_S has not received the S stage scan signal, so at the S stage register SR_S will not drive the corresponding pixel circuit through the corresponding gate lines.

In some embodiments, the third switch unit T13 and the fourth switch unit T14 are arranged between the first switch unit T11 and the second switch unit T12. There is a longitudinal gap between the third switch unit T13 and the first switch unit T11, and the fourth switch unit T14 and the second switch unit T12 also have a longitudinal gap.

In the foregoing embodiment, only one voltage regulator circuit of the register is described. As shown in FIG. 1, in some embodiments, each stage register of the driving circuit includes two voltage regulator circuits to ensure the component life. This indicates that the S stage register SR_S further includes a second voltage regulator circuit 220. The second voltage regulator circuit 220 includes a fifth switch unit T15 of the S stage register SR_S, a sixth switch unit T16 of the S stage register SR_S, a seventh switch unit T17 of the S stage register SR_S, and an eighth switch unit T18 of the S stage register SR_S.

The control terminal of the fifth switch unit T15 is electrically connected to the first connect line L31. The control terminal of the sixth switch unit T16 is electrically connected to the second connect line L32. Control terminals of the seventh switch unit T17 and the eighth switch unit T18 are electrically connected through the third connect line L33. Accordingly, the second voltage regulator circuit uses the connection path formed by "the fifth switch unit T15, the first connect line L31, the register SR_S+A, the second connect line L32, the sixth switch unit T16" to make the sixth switch unit T16 receive the S stage control signal.

As mentioned above, in some embodiments, the positions of the transistors and switch units on the first voltage regulator circuit 210 and the positions of the transistors and switch units on second voltage regulator circuit 220 correspond to each other. Alternatively stated, the positions of the fifth switch unit T15, the sixth switch unit T16, the seventh switch unit T17 and the eighth switch unit T18 are centered on the third connect line L33, and are symmetrical with the positions of the first switch unit T11, the second switch unit T12, the third switch unit T13 and the fourth switch unit T14.

Similarly, the (S+A) stage register SR_S+A further includes two voltage regulator circuits, such as the third voltage regulator circuit 230 and the fourth voltage regulator circuit 240 (the circuit structure is equivalent to the voltage regulator circuit 110, 120 in the equivalent circuit shown in FIG. 1). The third voltage regulator circuit 230 receives the (S+A) stage control signal through the first switch unit T21 and the second switch unit T22, so that the third voltage regulator circuit 230 performs voltage regulation and outputs the (S+A) stage scan signal.

The fourth voltage regulator circuit 240 includes a fifth switch unit T25 of the (S+A) stage register SR_S+A, a sixth switch unit T26 of the (S+A) stage register SR_S+A, a seventh switch unit T27 of the (S+A) stage register SR_S+A, and an eighth switch unit T28 of the (S+A) stage register SR_S+A. The fifth switch unit T25 and the sixth switch unit T26 are configured to receive the (S+A) stage control signal. The seventh switch unit T27 and the eighth switch unit T28 are electrically connected through the fourth connect line L34. Since the operation of the (S+A) stage register SR_S+A and the operation of the S stage register SR_S are similar, thus a description in this regard is not further provided herein.

In some embodiments, the position of the fourth voltage regulator circuit 240 corresponds to the position of the third voltage regulator circuit 230. As shown in FIG. 4B, the positions of the fifth switch unit T25, the sixth switch unit T26, the seventh switch unit T27 and the eighth switch unit T28 are centered on the fourth connect line L34, and are symmetrical with the positions of the first switch unit T21, the second switch unit T22, the third switch unit T23 and the fourth switch unit T24.

In some embodiments, the first connect line L31 and the second connect line L32 are arranged along the first direction (e.g., longitudinal direction). The multiple registers of the driving circuit 200 (i.e., the S stage register SR_S, the (S+A) stage register SR_S+A) are also arranged along the first direction. Therefore, the first connect line L31 and the second connect line L32 may be arranged on the longitudinal gap between multiple switches of the driving circuit 200, so that the occupied area of the driving circuit 200 is smaller.

As shown in the equivalent circuit diagram of FIG. 1, the driving circuit 200 includes multiple transistors, which are used as switch units T11-T18 or switch units T21-T28. The transistors (switch units) are arranged on a first side of the substrate (e.g., a front side, which may be the first metal layer on the substrate). The control terminals (e.g., gates) of the transistors are exposed on a second side of the substrate (e.g., a back side, which may be the second metal layer on the substrate). The first connect line L31, the second connect line L32, the third connect line L33 and the fourth connect line L34 are arranged on the second side of the substrate, so as to be electrically connected to the control terminals of the transistors. As shown in FIGS. 3-4C, the connect lines L31-L34 are indicated by thick lines to indicate that the connect lines L31-L34 are arranged on the second side of the substrate.

As shown in FIG. 4C, the registers SR_N−1, SR_N are the last two stages registers in the driving circuit 200. According to the layout diagram shown in FIG. 4B, the switch units T31, T35 of the register SR_N−1 transmits the (N−1) stage control signal to the next stage register through the connect line. Next, the switch units T31, T35 of the register SR_N−1 transmits the (N−1) stage control signal to the switch units T32, T36 through another connect line. However, since the register SR_N−1 is the second last stage register in the driving circuit 200, in some embodiments, the switch units T31, T35 are connected to the switch units T32, T36 through the fifth connect line L35. As shown in FIG. 4C, the fifth connect line L35 is U-shaped, and the portions adjacent to both ends of the fifth connect line L35 are arranged along the first direction (e.g., longitudinal direction). The middle portion of the fifth connect line L35 is arranged along the second direction (e.g., lateral direction), so that the fifth connect line L35 does not occupy excessive wiring area. FIG. 4C shows an example of the driving circuit 200 and "A=2" (also refer to to the circuit architecture in FIG. 3). "A" is a positive integer. If A is adjusted, the stages of the signal across registers will be adjusted accordingly.

The elements, operations, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A driving circuit, comprising:
   an S stage register comprising a first voltage regulator circuit, wherein the first voltage regulator circuit of the S stage register comprises a first switch unit of the S stage register and a second switch unit of the S stage register, the first switch unit of the S stage register and the second switch unit of the S stage register are configured to receive an S stage control signal, so that the S stage register performs voltage regulation and outputs an S stage scan signal;
   a first connect line electrically connected to the first switch unit of the S stage register;
   an (S+A) stage register comprising a first switch unit of the (S+A) stage register, a second switch unit of the (S+A) stage register, a third switch unit of the (S+A) stage register and a fourth switch unit of the (S+A) stage register, wherein the third switch unit of the (S+A) stage register is electrically connected to the first connect line and the fourth switch unit of the (S+A) stage register to receive the S stage control signal, so that the (S+A) stage register performs voltage regulation, both S and A are positive integers; and
   a second connect line electrically connected to a control terminal of the second switch unit of the S stage register and a control terminal of the fourth switch unit of the (S+A) stage register.

2. The driving circuit of claim 1, wherein the first voltage regulator circuit of the S stage register further comprises a third switch unit of the S stage register and a fourth switch unit of the S stage register, the third switch unit of the S stage register and the fourth switch unit of the S stage register are electrically connected through a third connect line to receive an (S−B) stage control signal, so that the S stage register performs voltage regulation.

3. The driving circuit of claim 2, wherein the third switch unit of the S stage register and the fourth switch unit of the S stage register are arranged between the first switch unit of the S stage register and the second switch unit of the S stage register.

4. The driving circuit of claim 3, wherein the S stage register further comprises:
   a second voltage regulator circuit of the S stage register comprising a fifth switch unit of the S stage register, a sixth switch unit of the S stage register, a seventh switch unit of the S stage register and a eighth switch unit of the S stage register, wherein the fifth switch unit of the S stage register is electrically connected to the first connect line, the sixth switch unit of the S stage register is electrically connected to the second connect line, and the seventh switch unit of the S stage register and the eighth switch unit of the S stage register are electrically connected through the third connect line.

5. The driving circuit of claim 4, wherein positions of the fifth switch unit of the S stage register, the sixth switch unit of the S stage register, the seventh switch unit of the S stage register and the eighth switch unit of the S stage register are centered on the third connect line, and are symmetrical with the positions of the first switch unit of the S stage register, the second switch unit of the S stage register, the third switch unit of the S stage register and the fourth switch unit of the S stage register.

6. The driving circuit of claim 1, wherein the (S+A) stage register further comprises:
   a first voltage regulator circuit of the (S+A) stage register configured to receive an (S+A) stage control signal through the first switch unit of the (S+A) stage register and the second switch unit of the (S+A) stage register to perform voltage regulation and output an (S+A) stage scan signal.

7. The driving circuit of claim 6, wherein the (S+A) stage register further comprises:
   a second voltage regulator circuit of the (S+A) stage register comprising a fifth switch unit of the (S+A) stage register, a sixth switch unit of the (S+A) stage register, a seventh switch unit of the (S+A) stage register and an eighth switch unit of the (S+A) stage register, wherein the fifth switch unit of the (S+A) stage register and the sixth switch unit of the (S+A) stage register are configured to receive the (S+A) stage control signal, and the seventh switch unit of the (S+A) stage register and the eighth switch unit of the (S+A) stage register are electrically connected through a fourth connect line.

8. The driving circuit of claim 7, wherein positions of the fifth switch unit of the (S+A) stage register, the sixth switch unit of the (S+A) stage register, the seventh switch unit of the (S+A) stage register and the eighth switch unit of the (S+A) stage register are centered on the fourth connect line, and are symmetrical with the positions of the first switch unit of the (S+A) stage register, the second switch unit of the (S+A) stage register, the third switch unit of the (S+A) stage register and the fourth switch unit of the (S+A) stage register.

9. The driving circuit of claim 1, wherein the first connect line and the second connect line are arranged along a first direction, and the S stage register and the (S+A) stage register are arranged along the first direction.

10. The driving circuit of claim 1, wherein the first switch unit of the S stage register and the second switch unit of the S stage register are arranged on a first side of a substrate, and the first connect line and the second connect line are arranged on a second side of the substrate.

\* \* \* \* \*